(12) United States Patent
Liang et al.

(10) Patent No.: US 9,006,891 B2
(45) Date of Patent: Apr. 14, 2015

(54) METHOD OF MAKING A SEMICONDUCTOR DEVICE HAVING A POST-PASSIVATION INTERCONNECT STRUCTURE

(71) Applicant: Taiwan Semiconductor Manufacturing Company, Ltd., Hsinchu (TW)

(72) Inventors: Shih-Wei Liang, Daija Township (TW); Hsien-Wei Chen, Sinying (TW); Ying-Ju Chen, Tuku Township (TW); Tsung-Yuan Yu, Taipei (TW); Mirng-Ji Lii, Sinpu Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/058,466

(22) Filed: Oct. 21, 2013

(65) Prior Publication Data

US 2014/0045326 A1    Feb. 13, 2014

Related U.S. Application Data

(63) Continuation of application No. 13/272,540, filed on Oct. 13, 2011, now Pat. No. 8,581,400.

(51) Int. Cl.
*H01L 29/40* (2006.01)
*H01L 23/10* (2006.01)
(Continued)

(52) U.S. Cl.
CPC ............ *H01L 24/11* (2013.01); *H01L 23/3192* (2013.01); *H01L 23/3114* (2013.01);
(Continued)

(58) Field of Classification Search
CPC ............ H01L 23/3192; H01L 21/76841; H01L 23/3114; H01L 24/11; H01L 2224/13111; H01L 2224/13116; H01L 2224/13139; H01L 2224/13147; H01L 222/1155; H01L 2224/13113; H01L 2224/0226; H01L 2224/02235; H01L 2224/02255; H01L 2224/0345; H01L 2224/03452; H01L 2224/05147
USPC .......... 257/737, 751, 415, 687, E23.068, 707; 438/612, 613, 658, 754
See application file for complete search history.

(56) References Cited

U.S. PATENT DOCUMENTS 5,466,635 A   11/1995  Lynch et al.
6,218,281 B1   4/2001  Watanabe et al.
(Continued)

FOREIGN PATENT DOCUMENTS

JP          5-335313      12/1993
JP          2000-228420    8/2000

*Primary Examiner* — Long K Tran
*Assistant Examiner* — Dzung Tran
(74) *Attorney, Agent, or Firm* — Lowe Hauptman & Ham, LLP

(57) ABSTRACT

A method of making a semiconductor device includes forming a passivation layer overlying a semiconductor substrate, the semiconductor substrate having a first region and a second region, wherein the first region is a conductive pad and the second region is adjacent to the first region. The method further includes forming a first protective layer overlying the passivation layer and forming an interconnect layer overlying the first protective layer. The method further includes forming a plurality of slots in the second region and forming a second protective layer overlying the interconnect layer, wherein the second protective layer fills each slot of the plurality of slots. The method further includes exposing a portion of the interconnect layer through the second protective layer; forming a barrier layer on the exposed portion of the interconnect layer; and forming a solder bump on the barrier layer.

20 Claims, 7 Drawing Sheets

(51) Int. Cl.
*H01L 23/48* (2006.01)
*H01L 21/44* (2006.01)
*H01L 23/00* (2006.01)
*H01L 23/31* (2006.01)
*H01L 21/768* (2006.01)
*H01L 23/525* (2006.01)

(52) U.S. Cl.
CPC ...... *H01L23/3171* (2013.01); *H01L 21/76841* (2013.01); *H01L 2224/0226* (2013.01); *H01L 24/05* (2013.01); *H01L 24/13* (2013.01); *H01L 24/16* (2013.01); *H01L 2224/02235* (2013.01); *H01L 2224/02255* (2013.01); *H01L 2224/0345* (2013.01); *H01L 2224/03452* (2013.01); *H01L 2224/0346* (2013.01); *H01L 2224/05008* (2013.01); *H01L 2224/05022* (2013.01); *H01L 2224/05124* (2013.01); *H01L 2224/05147* (2013.01); *H01L 2224/05571* (2013.01); *H01L 2224/05609* (2013.01); *H01L 2224/05611* (2013.01); *H01L 2224/05639* (2013.01); *H01L 2224/05644* (2013.01); *H01L 2224/05655* (2013.01); *H01L 2224/05664* (2013.01); *H01L 2224/11334* (2013.01); *H01L 2224/11849* (2013.01); *H01L 2224/13022* (2013.01); *H01L 2224/81191* (2013.01); *H01L 2224/81411* (2013.01); *H01L 2224/81413* (2013.01); *H01L 2224/81416* (2013.01); *H01L 2224/81439* (2013.01); *H01L 2224/81447* (2013.01); *H01L 2224/81455* (2013.01); *H01L 2224/81815* (2013.01); *H01L 2224/13006* (2013.01); *H01L 23/525* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/16227* (2013.01); *H01L 2224/16225* (2013.01)

(56) References Cited

U.S. PATENT DOCUMENTS

| | | | |
|---|---|---|---|
| 6,229,220 | B1 | 5/2001 | Saitoh et al. |
| 6,578,754 | B1 | 6/2003 | Tung |
| 6,592,019 | B2 | 7/2003 | Tung |
| 6,818,545 | B2 | 11/2004 | Lee et al. |
| 6,853,076 | B2 | 2/2005 | Datta et al. |
| 6,917,119 | B2 | 7/2005 | Lee et al. |
| 7,064,436 | B2 | 6/2006 | Ishiguri et al. |
| 7,391,112 | B2 | 6/2008 | Li et al. |
| 2005/0017355 | A1* | 1/2005 | Chou et al. ............ 257/738 |
| 2005/0176233 | A1 | 8/2005 | Joshi et al. |
| 2007/0018331 | A1 | 1/2007 | Chen |
| 2008/0251924 | A1 | 10/2008 | Lin et al. |
| 2008/0265413 | A1* | 10/2008 | Chou et al. ............ 257/737 |
| 2008/0308934 | A1* | 12/2008 | Alvarado et al. ...... 257/738 |
| 2009/0026608 | A1* | 1/2009 | Tsai et al. ............. 257/737 |
| 2009/0115058 | A1* | 5/2009 | Yu et al. ................ 257/738 |
| 2009/0267213 | A1 | 10/2009 | Lin et al. |
| 2010/0078772 | A1* | 4/2010 | Robinson ............... 257/621 |
| 2010/0090318 | A1 | 4/2010 | Hsu et al. |
| 2010/0244241 | A1 | 9/2010 | Marimuthu et al. |
| 2010/0295138 | A1 | 11/2010 | Montanya Silvestre et al. |
| 2011/0049705 | A1 | 3/2011 | Liu et al. |

\* cited by examiner

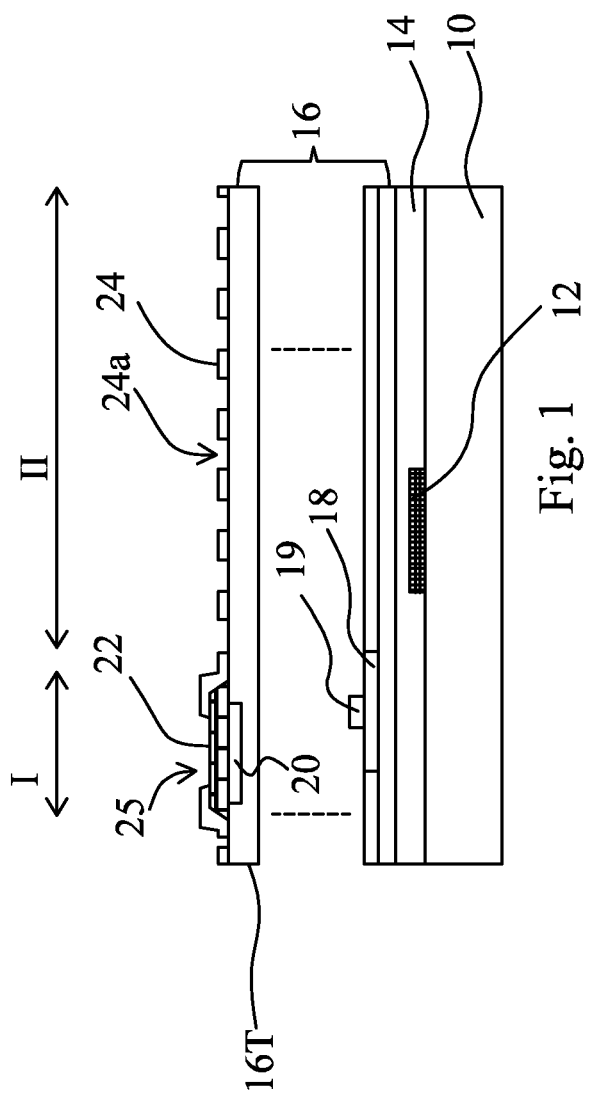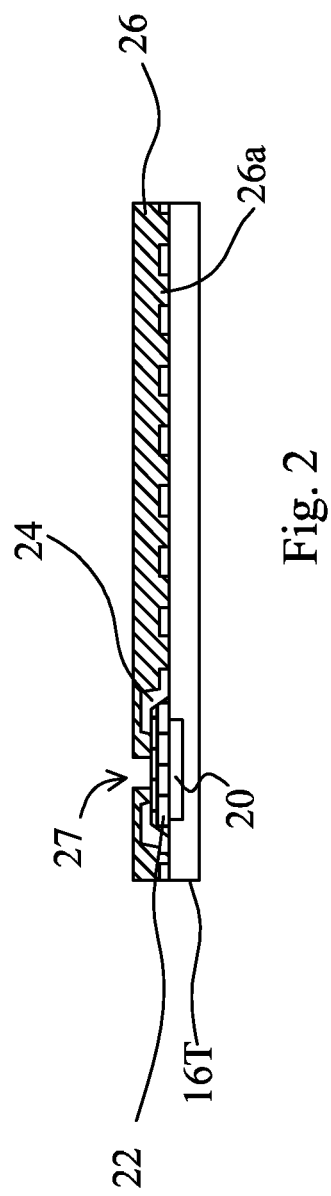

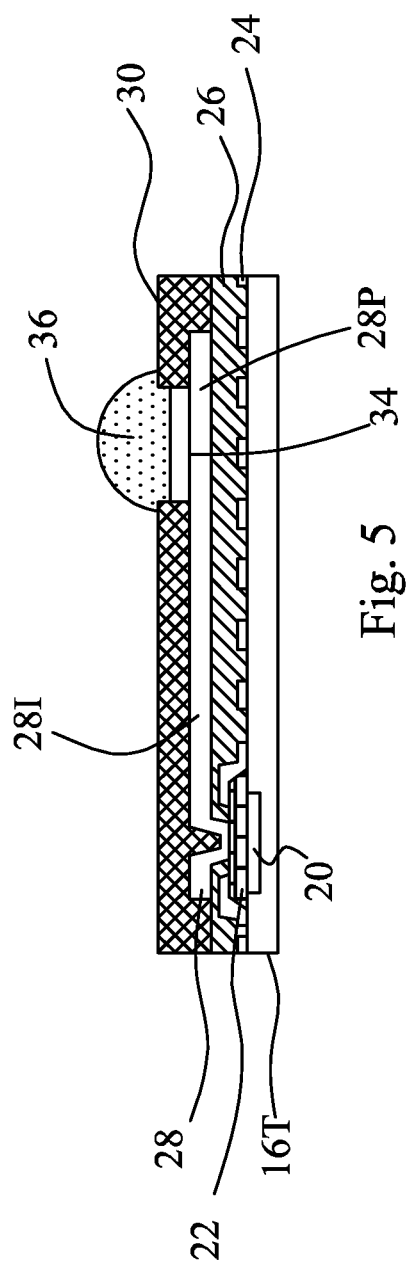
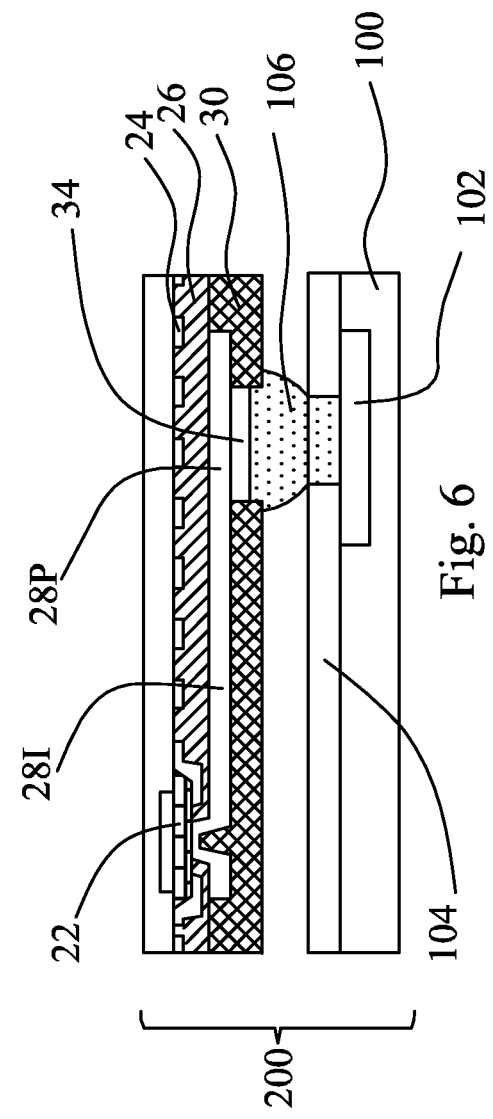

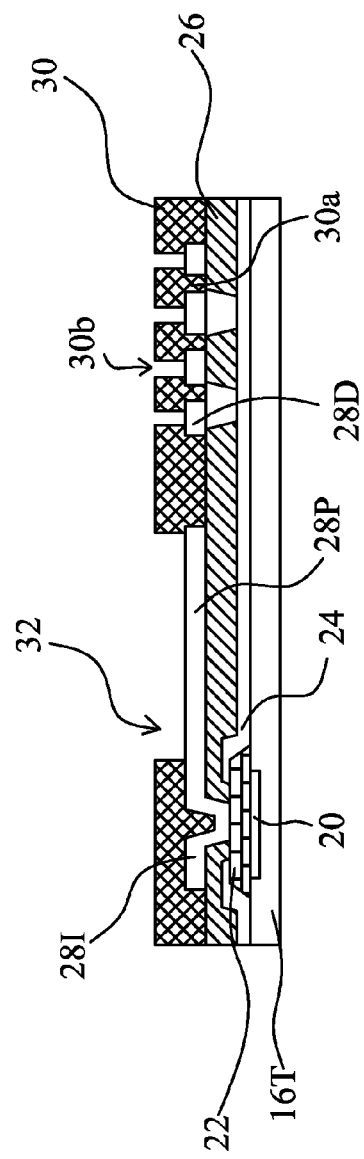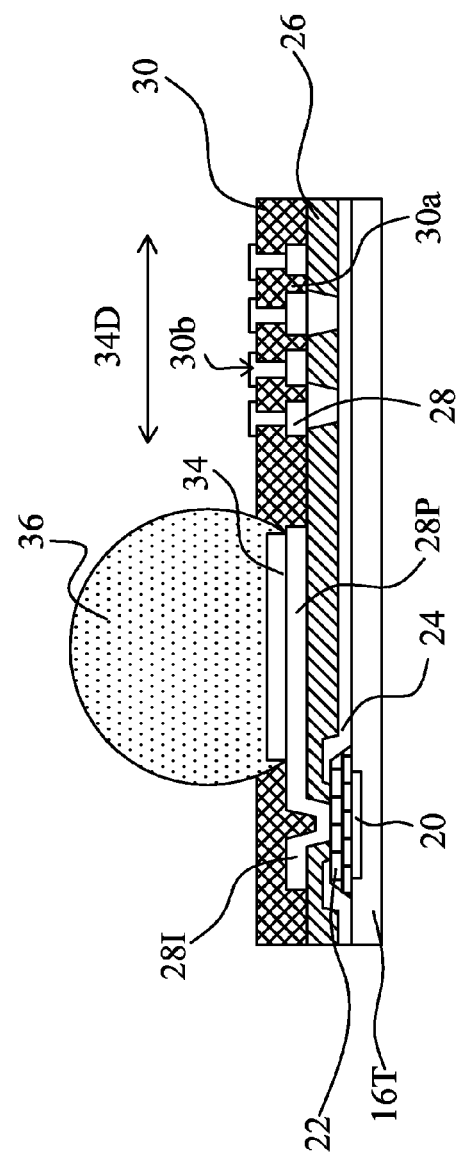

METHOD OF MAKING A SEMICONDUCTOR DEVICE HAVING A POST-PASSIVATION INTERCONNECT STRUCTURE

PRIORITY CLAIM

The present application is a continuation of U.S. application Ser. No. 13/272,540, filed Oct. 13, 2011, which is incorporated by reference herein in its entirety.

RELATED APPLICATION

The present application is related to co-pending U.S. filing Ser. No. 13/167,946 filed on Jun. 24, 2011, which is expressly incorporated by reference herein in its entirety.

BACKGROUND

Modern integrated circuits are made up of millions of active devices such as transistors and capacitors. These devices are initially isolated from each other, but are later interconnected together to form functional circuits. Typical interconnect structures include lateral interconnections, such as metal lines (wirings), and vertical interconnections, such as via openings and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package. Structurally, a bump actually contains the bump itself and an "under bump metallurgy" (UBM) located between the bump and an I/O pad.

Wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films and bumps. The PPI formation processes known to the inventors, however, have polymer film peeling issues, which may induce weak interfaces in the PPI structure and cause failures in the device.

BRIEF DESCRIPTION OF THE DRAWINGS

FIGS. 1-5 are cross-sectional views illustrating various intermediate stages of a method of forming a semiconductor device having a PPI structure in accordance with exemplary embodiments; and FIG. 6 is a cross-sectional view of a packaging assembly in accordance with exemplary embodiments.

FIGS. 12-13 are cross-sectional views illustrating a method of forming a PPI structure in accordance with exemplary embodiments.

DETAILED DESCRIPTION

Figure 3:
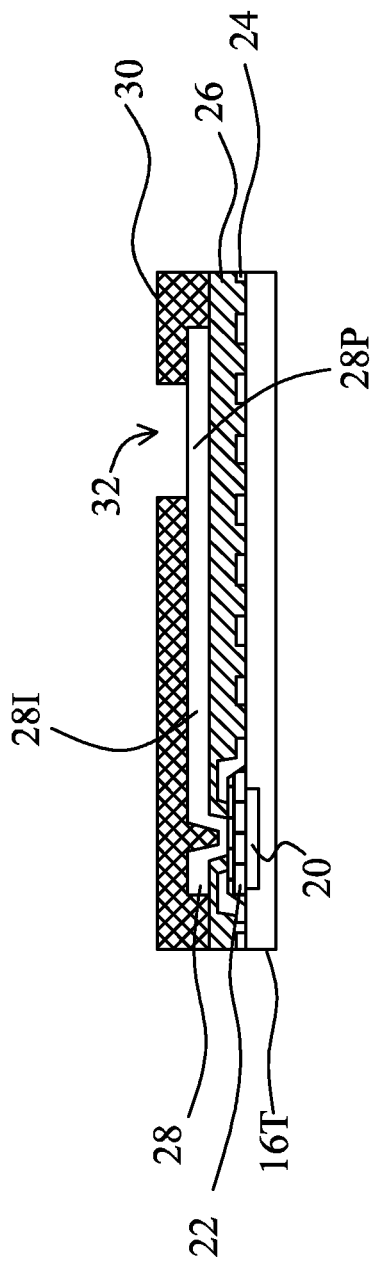

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-5 illustrate various intermediate stages of a method of forming a PPI structure in a semiconductor device in accordance with an embodiment. Referring first to FIG. 1, a portion of a substrate 10 having electrical circuitry 12 formed thereon is shown in accordance with an embodiment. The substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used.

Electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 14. The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). It should also be noted that the ILD layer 14 may comprise a plurality of dielectric layers. Contacts (not shown) may be formed through the ILD layer 14 to provide an electrical contact to the electrical circuitry 12. The contacts may be formed of, for example, one or more layers of TaN, Ta, TiN, Ti, CoW, copper, tungsten, aluminum, silver, or the like, or combinations thereof.

One or more inter-metal dielectric (IMD) layers 16 and the associated metallization layers are formed over the ILD layer 14. Generally, the one or more IMD layers 16 and the associated metallization layers (including metal lines 18, via openings 19 and metal layer 20) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. It should be noted that one or more etch stop layers (not shown) may be positioned between adjacent ones of the dielectric layers, e.g., the ILD layer 14 and the IMD layers 16. Generally, the etch stop layers provide a mechanism to stop an etching process when forming via openings and/or contacts. The etch stop layers are formed of a dielectric material having a different etch selectivity from adjacent layers, e.g., the underlying semiconductor substrate 10, the overlying ILD layer 14, and the overlying IMD layers 16. In an embodiment, etch stop layers may be formed of SiN, SiCN, SiCO, CN, combinations thereof, or the like, deposited by CVD or PECVD techniques.

The metallization layers, including metal lines 18 and via openings 19, may be formed of copper or copper alloys, although they can also be formed of other metals. Further, the metallization layers include a top metal layer 20 formed and patterned in or on the uppermost IMD layer 16T to provide external electrical connections and to protect the underlying layers from various environmental contaminants. The uppermost IMD layer 16T may be formed of a dielectric material, such as silicon nitride, silicon oxide, undoped silicon glass, and the like. In subsequent drawings, semiconductor substrate 10, electrical circuitry 12, ILD layer 14, IMD layers 16, and metallization layers 18 and 19 are not illustrated. The top metal layer 20 is formed as a part of the top metallization layer on the uppermost IMD layer 16T.

Thereafter, a conductive pad 22 is formed in a first region I to contact the top metal layer 20, or alternatively, electrically coupled to top metal layer 20 through a via. The conductive pad 22 may be formed of aluminum, aluminum copper, aluminum alloys, copper, copper alloys, or the like.

With reference to FIG. 1, one or more passivation layers, such as passivation layer 24, are formed over the conductive pads 22 and the uppermost IMD layer 16T. The passivation layer 24 may be formed of a dielectric material, such as undoped silicate glass (USG), silicon nitride, silicon oxide, silicon oxynitride or a non-porous material by any suitable method, such as CVD, PVD, or the like. The passivation layer 24 may be a single layer or a laminated layer. One of ordinary skill in the art will appreciate that a single layer of conductive pad and a passivation layer are shown for illustrative purposes only. As such, other embodiments may include any number of conductive layers and/or passivation layers.

The passivation layer 24 is then patterned by the use of masking methods, lithography technologies, etching processes, or combinations thereof, such that an opening 25 in the first region I and at least one slot 24a in the second region II are formed. In the first region I, which is the conductive pad region, the passivation layer 24 is patterned to cover the peripheral portion of the conductive pad 22, and to expose the central portion of conductive pad 22 through the opening 25. In a second region II that is adjacent to the conductive pad region, the passivation layer 24 is patterned to provide the slot 24a for improving the adhesion at an interface between the passivation layer 24 and the subsequent deposited material layers. In some embodiments, more than two slots 24a are formed in the passivation layer 24. It should also be noted that the placement of the slots 24a is provided for illustrative purposes only and that the specific locations and patterns of the slots 24a may vary and may include, for example, an array of slots, lines of slots, staggered slots, a mesh-shape slot or the like. The illustrated slot sizes are provided for reference only and are not intended to be actual sizes or actual relative sizes.

Next, as shown in FIG. 2, a first protective layer 26 is formed on the passivation layer 24, filling the opening 25 and the slots 24a. The first protective layer 26 is the patterned to form an opening 27, through which at least a portion of the conductive pad 22 is exposed again. The first protective layer 26 filling the slot 24a forms a foot portion 26a embedded in the passivation layer 24. The first protective layer 26 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

Thereafter, a PPI structure 28 is formed and patterned on the first protective layer 26 and electrically connected the conductive pad 22 through the opening 27 as shown in FIG. 3. The PPI structure 28 that is an interconnect layer includes an interconnect line region 281 and a landing pad region 28P. The interconnect line region 281 and the landing pad region 28P may be formed simultaneously, and may be formed of a same conductive material. In an embodiment, the interconnect line region 281 extends to electrically connect the conductive pad 22 through the opening 27, and a bump feature will be formed over and electrically connected to the landing pad region 28P in subsequent processes. The PPI structure 28 may include, but is not limited to, for example copper, aluminum, copper alloy, or other mobile conductive materials using plating, electroless plating, sputtering, chemical vapor deposition methods, and the like. In some embodiments, the PPI structure 28 may further include a nickel-containing layer (not shown) on top of a copper-containing layer. In some embodiments, the PPI structure 28 may also function as power lines, re-distribution lines (RDL), inductors, capacitors or any passive components. Through the routing of PPI structure 28, the landing pad region 28P may be, or may not be, directly over the conductive pad 22.

With reference to FIG. 3, a second protective layer 30 is then formed on the substrate 10 to cover the PPI structure 28 and the exposed portions of the first protective layer 26. Using photolithography and/or etching processes, the second protective layer 30 is further patterned to form an opening 32 exposing at least a portion of the landing pad region 28P. The formation methods of the opening 32 may include lithography, wet or dry etching, laser drill, and/or the like. In some embodiments, the second protective layer 30 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 30 is formed of a non-organic material selected from undoped silicate glass (USG), silicon nitride, silicon oxynitride, silicon oxide, and combinations thereof.

Figure 4:
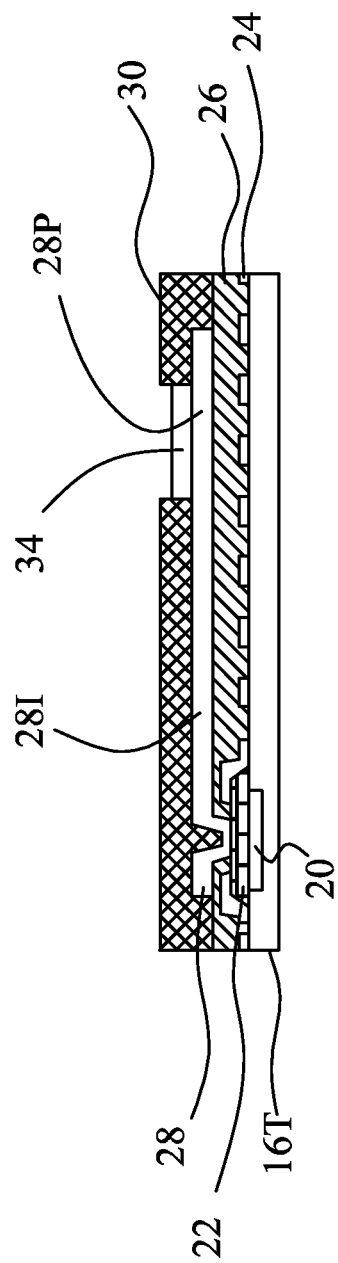

In order to protect the exposed portion of the landing pad region 28P, the process proceeds to the formation of a barrier layer 34 within the opening 32 as shown in FIG. 4. The barrier layer 34 is formed on the landing pad region 28P within the opening 32 to prevent copper in the PPI structure 28 from diffusing into bonding material, such as solder alloy, that is used to bond the substrate 10 to external features. The prevention of copper diffusion increases the reliability and bonding strength of the package. The barrier layer 34 may include nickel (Ni), tin, tin-lead (SnPb), gold (Au), silver, palladium (Pd), indium (In), nickel-palladium-gold (NiPdAu), nickel-gold (NiAu), a Ni-based alloy, an Au-based alloy, or a Pd-based alloy, other similar materials, or an alloy by an electroless plating process or an immersion plating process. The barrier layer 34 has a thickness about 0.1-10 µm. In one embodiment, the barrier layer 34 is a triple-layer structure including an electroless Ni layer, an electroless Pd layer, and an immersion Au layer, which is also known as an ENEPIG structure. For example, the ENEPIG structure may have the electroless Ni layer with a thickness of at least 2 µm, the electroless Pd layer with a thickness of at least 0.02 µm and the immersion Au layer with a thickness of at least 0.01 µm. In one embodiment, the barrier layer 34 is a dual-layer structure including an electroless Ni layer and an electroless Pd layer, named an ENEP structure. In one embodiment, the barrier layer 34 is a single-layer structure including an electroless Ni layer, which is also known as an EN structure. In one embodiment, the barrier layer 34 is a dual-layer structure including an electroless Ni layer and an immersion Au layer, which is also known as an ENIG structure.

As shown in FIG. 5, a solder bump 36 is formed on the barrier layer 34. In one embodiment, the solder bump 36 is formed by attaching a solder ball on the barrier layer 34 and then reflowing the material. The solder bump 36 may include a lead-free pre-solder layer, SnAg, or a solder material including alloys of tin, lead, silver, copper, nickel, bismuth, or combinations thereof. A bump structure is therefore completed on a semiconductor device. The presented embodiments provide the slots 24a in the passivation layer 24 to enhance the interface adhesion between the passivation layer 24 and the first protective layer 26. This can improve the strength in the PPI structure, and the peeling and cracking of the polymer layer may be reduced and/or eliminated. Accordingly, in packaging assembly processes, joint reliability can be increased and bump fatigue can be reduced.

After the bump formation, for example, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

FIG. 6 is a cross-sectional diagram depicting an exemplary embodiment of a flip-chip assembly. The structure shown in FIG. 5 is flipped upside down and attached to another substrate 100 at the bottom of FIG. 6. The substrate 100 may be a package substrate, board (e.g., a printed circuit board (PCB)), a wafer, a die, an interposer substrate, or other suitable substrate. The bump structure is coupled to the substrate 100 through various conductive attachment points. For example, a conductive region 102 is formed and patterned on the substrate 100. The conductive region 102 is a contact pad or a portion of a conductive trace, which is presented by a mask layer 104. In one embodiment, the mask layer 104 is a solder resist layer formed and patterned on the substrate 100 to expose the conductive region 102. The mask layer 104 has a mask opening, which provides a window for solder joint formation. For example, a solder layer including alloys of tin, lead, silver, copper, nickel, bismuth, or combinations thereof may be provided on the conductive region 102. The substrate 10 can be coupled to the substrate 100 to form a joint solder structure 106 between the barrier layer 34 and the conductive region 102. An exemplary coupling process includes a flux application, chip placement, reflowing of melting solder joints, and/or cleaning of flux residue. The integrated circuit substrate 10, the joint solder structure 106, and the other substrate 100 may be referred to as a packaging assembly 200, or in the present embodiment, a flip-chip packaging assembly.

Figure 7:
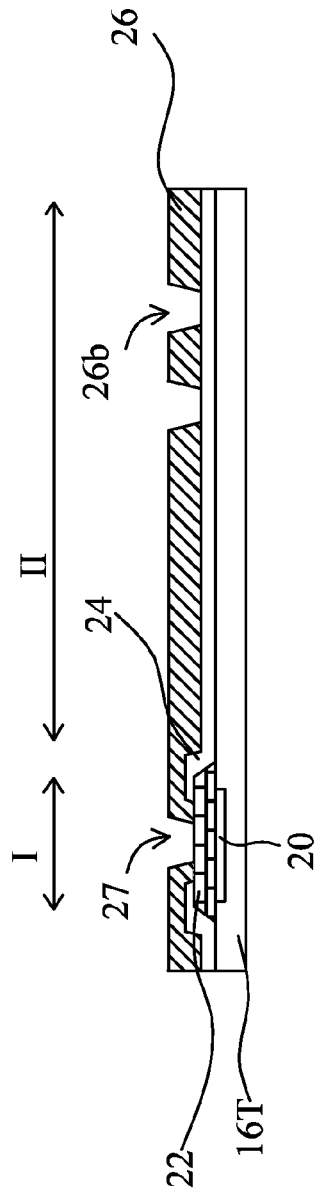
FIGS. 7-9 are cross-sectional views illustrating various intermediate stages of a method of forming a semiconductor device having a PPI structure in accordance with exemplary embodiments.
Figure 8:
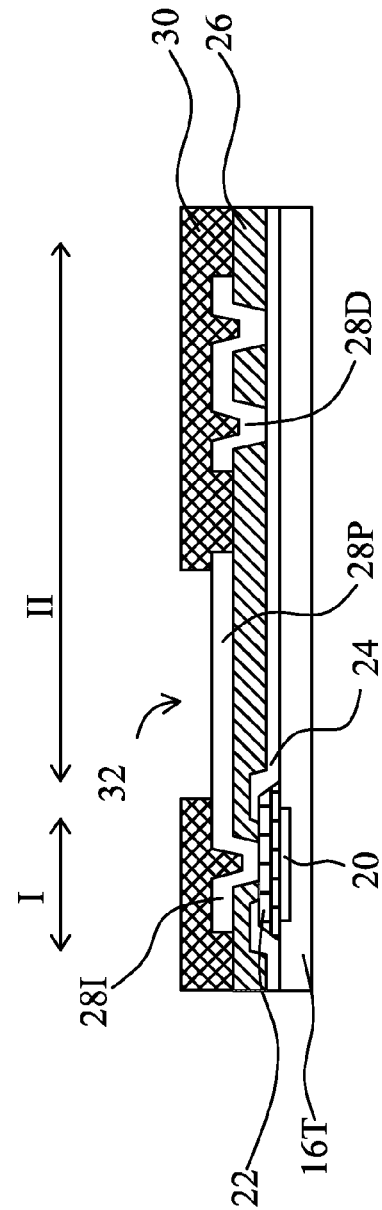
Figure 9:
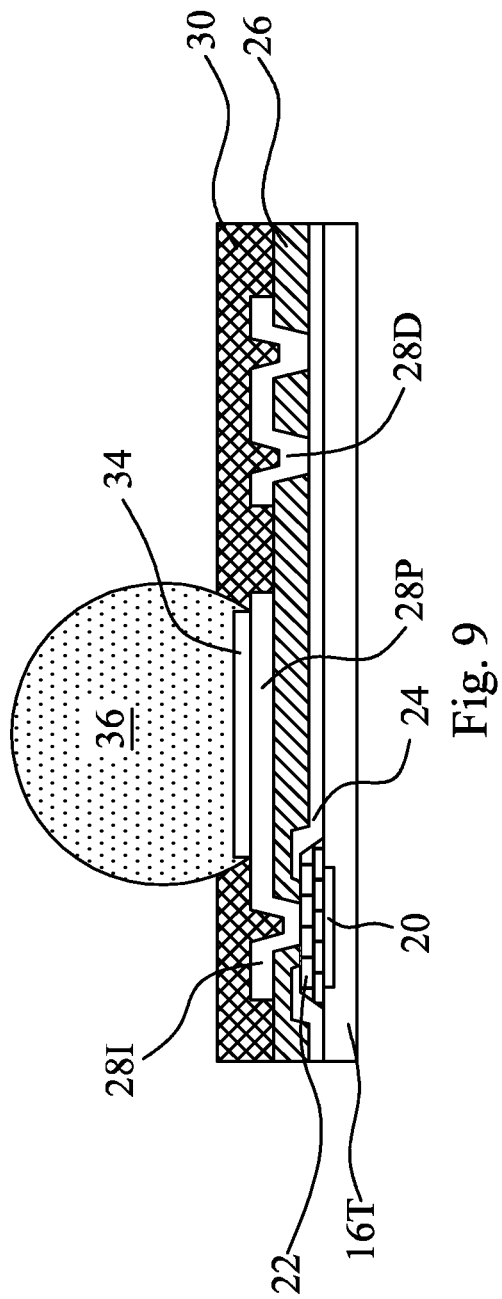

FIGS. 7-9 illustrate various intermediate stages of an exemplary method of forming a PPI structure in a semiconductor device in accordance with an alternative embodiment. Unless specified otherwise, the reference numerals in these embodiments represent like elements in the embodiments illustrated in FIGS. 1-6.

Referring to FIG. 7, the first protective layer 26 is formed on the passivation layer 24 to fill the opening 25. The first protective layer 26 is the patterned to form the opening 27 within the first region I, through which at least a portion of the conductive pad 22 is exposed again. The first protective layer 26 is also patterned to form another slot 26b in the second region II, which exposes at least one portion of the passivation layer 24 outside the conductive pad region. In some embodiments, more than two slots 26b are formed in the first protective layer 26. It should also be noted that the placement of the slots 26b is provided for illustrative purposes only and that the specific locations and patterns of the slots 26b may vary and may include, for example, an array of openings, lines of slots, staggered slots, a mesh-shape slot or the like. The illustrated slot sizes are provided for reference only and are not intended to be actual sizes or actual relative sizes.

Thereafter, as shown in FIG. 8, the PPI structure 28 is formed on the first protective layer 26 to fill the openings 27 and 26b. The PPI structure 28 is then patterned to provide the interconnect line region 281, the landing pad region 28P, and a dummy region 28D. In an embodiment, the dummy region 28D is formed in at least one of the slots 26b in the first protective layer 26, and electrically separated from the landing pad region 28P and the interconnect line region 281. In some embodiments, the dummy region 28D includes the PPI material filling more than two slots 26b and continuously extending to the surface of the first protective layer 26.

With reference to FIG. 8, the second protective layer 30 is then formed on the substrate 10 to cover the PPI structure 28 and the exposed portions of the first protective layer 26. Next, the second protective layer 30 is patterned to form the opening 32 exposing the landing pad region 28P. As shown in FIG. 9, the barrier layer 34 and the solder bump 36 are formed on the exposed portion of the landing pad region 28P.

The presented embodiments provide the slots 26b in the first protective layer 26 to enhance the interface adhesion between the PPI structure 28 and the first protective layer 26. This can improve the strength in the PPI structure, and the peeling and cracking of the polymer layer may be reduced and/or eliminated. Accordingly, in packaging assembly processes, joint reliability can be increased and bump fatigue can be reduced.

Figure 10:
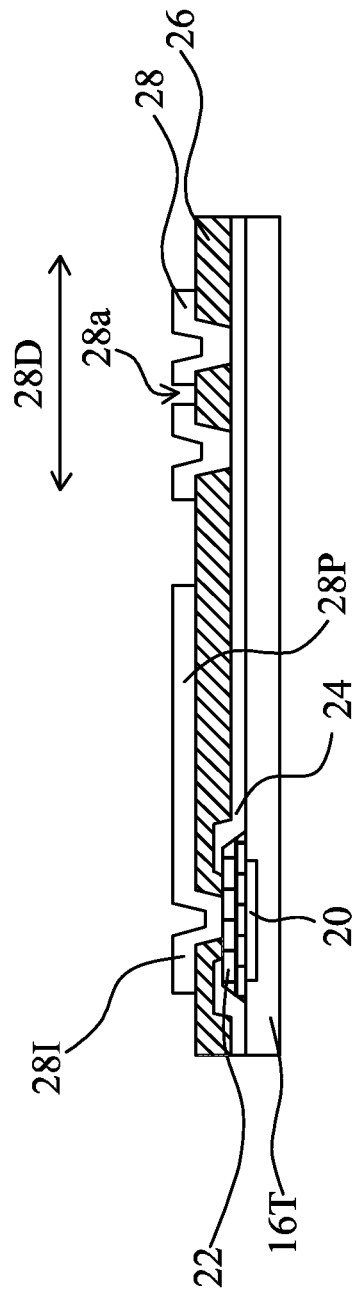
FIGS. 10-11 are cross-sectional views illustrating a method of forming a PPI structure in accordance with an exemplary embodiment.
Figure 11:
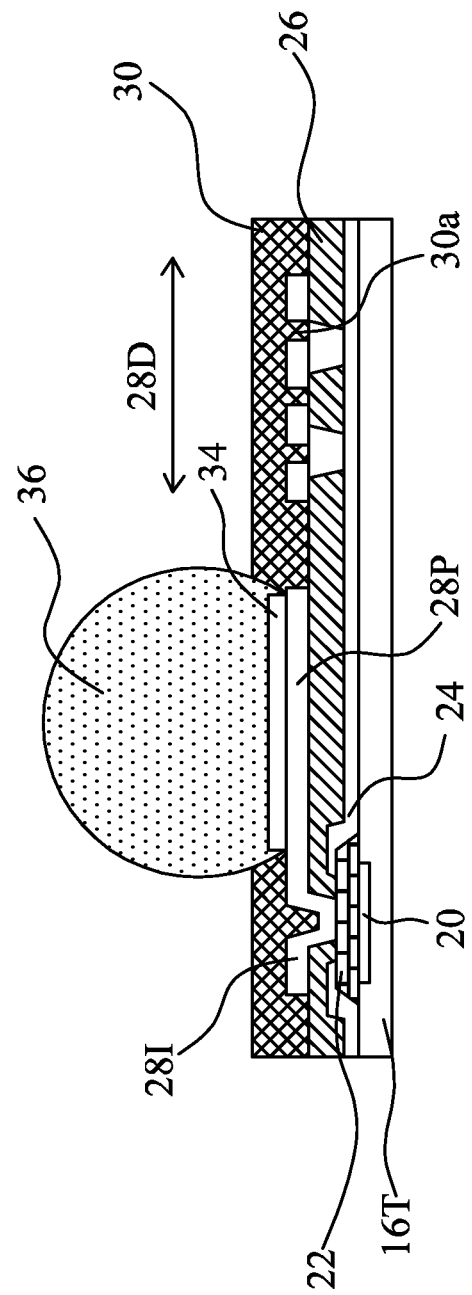

FIGS. 10-11 illustrate a method of forming a PPI structure in a semiconductor device in accordance with an alternative embodiment. Unless specified otherwise, the reference numerals in these embodiments represent like elements in the embodiments illustrated in FIGS. 1-9.

As shown in FIG. 10, the PPI structure 28 is formed on the first protective layer 26 to fill the opening 27. The PPI structure 28 is then patterned to provide the interconnect line region 28I, the landing pad region 28P, and the dummy region 28D. The dummy region 28D is electrically separated from the landing pad region 28P and the interconnect line region 28I. In an embodiment, the dummy region 28D includes at least one slot 28a, exposing at least one portion of the underlying first protective layer 26. In some embodiments, more than two slots 28a are formed in the dummy region 28D. It should also be noted that the placement of the slots 28a is provided for illustrative purposes only and that the specific locations and patterns of the slots 28a may vary and may include, for example, an array of slots, lines of slots, staggered slots, a mesh-shape slot or the like. The illustrated slot sizes are provided for reference only and are not intended to be actual sizes or actual relative sizes.

With reference to FIG. 11, the second protective layer 30 is then formed on the substrate 10 to cover the PPI structure 28 and the exposed portions of the first protective layer 26. The second protective layer 30 also fills the slots 28a of the PPI structure 28 so as to form foot portions 30a embedded in the dummy region 28D. The second protective layer 30 is further patterned to form the opening exposing the landing pad region 28P for the formation of the barrier layer 34 and the solder bump 36. The presented embodiments provide the slots 28a in the PPI structure 28 to enhance the interface adhesion between the first protective layer 26 and the second protective layer 30. This can improve the strength in the PPI structure, and the peeling and cracking of the polymer layer may be reduced and/or eliminated. Accordingly, in packaging assembly processes, joint reliability can be increased and bump fatigue can be reduced.

FIGS. 12-13 illustrate a method of forming a PPI structure in a semiconductor device in accordance with an alternative embodiment. Unless specified otherwise, the reference numerals in these embodiments represent like elements in the embodiments illustrated in FIGS. 10-11.

As shown in FIG. 12, after the formation of the PPI structure 28 with the dummy pad region 28D shown in FIG. 10, the second protective layer 30 is formed to cover the PPI structure 28 and the exposed portions of the first protective layer 26. The second protective layer 30 also fills the slots 28a so as to form foot portions 30a embedded in the dummy region 28D. The second protective layer 30 is also patterned to form the opening 32 exposing the landing pad region 28P of the PPI structure 28 for the formation of the barrier layer 34 and the solder bump 36. In addition, the second protective layer 30 is patterned to form at least one slot 30b exposing at least one portion of the underlying dummy region 28D. In some embodiments, the second protective layer 30 includes more than two slots 30b. It should also be noted that the placement of the slots 30b is provided for illustrative purposes only and that the specific locations and patterns of the slots 30b may vary and may include, for example, an array of slots, lines of slots, staggered slots, a mesh-shape slot or the like. The illustrated slot sizes are provided for reference only and are not intended to be actual sizes or actual relative sizes.

With reference to FIG. 13, the process proceeds to the formation of the barrier layer 34 within the opening 32 on which the solder bump 36 is formed. The barrier layer 34 is also formed in the slots 30b of the second protective layer 30, serving as dummy metal plugs 34a physically and electrically connecting the dummy region 28D of the PPI structure 28. The presented embodiments provide the slots 30b in the second protective layer 30 to enhance the interface adhesion between the PPI structure 28 and the second protective layer 30. This can improve the strength in the PPI structure, and the peeling and cracking of the polymer layer may be reduced and/or eliminated. Accordingly, in packaging assembly processes, joint reliability can be increased and bump fatigue can be reduced.

One aspect of this description relates to a method of making a semiconductor device. The method includes forming a passivation layer overlying a semiconductor substrate, the semiconductor substrate having a first region and a second region, wherein the first region is a conductive pad and the second region is adjacent to the first region. The method further includes forming a first protective layer overlying the passivation layer and forming an interconnect layer overlying the first protective layer. The method further includes forming a plurality of slots in the second region and forming a second protective layer overlying the interconnect layer, wherein the second protective layer fills each slot of the plurality of slots. The method further includes exposing a portion of the interconnect layer through the second protective layer; forming a barrier layer on the exposed portion of the interconnect layer; and forming a solder bump on the barrier layer.

Another aspect of this description relates to a method of making a packaging assembly. The method includes forming a connection structure over a first substrate, the first substrate having a first region and a second region, wherein the first region is a conductive pad and the second region is adjacent to the first region. Forming the connection structure includes forming a conductive pad on the first region and forming a passivation layer on the first region and the second region. Forming the connection structure further includes forming a first opening the passivation layer in the first region to partially expose the conductive pad and forming a first polymer layer overlying the passivation layer and comprising a second opening in the first region in the first polymer layer, the second opening to exposing the conductive pad. Forming the connection structure further includes forming a post-passivation interconnect (PPI) structure overlying the first polymer layer and filling the second opening of the first polymer layer, the PPI structure having a dummy pad region in the second region. Forming the connection structure further includes forming a second polymer layer overlying the PPI structure and comprising a third opening exposing a landing pad region of the PPI structure, the landing pad region electrically separated from the dummy pad region, and the second polymer layer further comprising a fourth opening exposing a portion of the dummy pad region. Forming the connection structure further includes forming a barrier layer on the exposed landing pad region of the PPI structure and on the exposed portion of the dummy pad region, wherein the barrier layer comprises at least one of a nickel (Ni) layer, a palladium (Pd) layer or a gold (Au) layer. The method further includes joining a conductive region of a second substrate to the connection structure of the first substrate.

Still another aspect of this description relates to a method of forming a semiconductor device. The method includes forming a passivation layer overlying a semiconductor substrate, wherein the semiconductor substrate has a first region and a second region, the first region is a conductive pad region, and the second region is adjacent to the first region. The method further includes forming a first protective layer overlying the passivation layer and forming an interconnect layer overlying the first protective layer, the interconnect layer having a landing pad region and a dummy pad region electrically separated from the landing pad region. The method further includes forming a second protective layer overlying the interconnect layer and comprising a first opening exposing the landing pad region and a second opening exposing a portion of the dummy pad region. The method further includes forming a barrier layer on the landing pad region and the exposed portion of the dummy pad region and forming a solder bump on the barrier layer formed on the landing pad region.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A method of making a semiconductor device, the method comprising:
    forming a passivation layer overlying a semiconductor substrate, the semiconductor substrate having a first region and a second region, wherein the first region is a conductive pad and the second region is adjacent to the first region;
    forming a first protective layer overlying the passivation layer;
    forming an interconnect layer overlying the first protective layer;
    forming a plurality of slots in the second region;
    forming a second protective layer overlying the interconnect layer, wherein the second protective layer fills each slot of the plurality of slots;
    exposing a portion of the interconnect layer through the second protective layer;
    forming a barrier layer on the exposed portion of the interconnect layer; and
    forming a solder bump on the barrier layer.

2. The method of claim 1, wherein exposing the portion of the interconnect layer comprises forming an opening in the second protection layer using at least one of wet etching, dry etching, or laser drilling.

3. The method of claim 1, wherein forming the first protective layer comprises depositing a dielectric material using chemical vapor deposition (CVD) or physical vapor deposition (PVD).

4. The method of claim 1, wherein forming the barrier layer comprises forming a copper diffusion preventing layer using electroless plating or immersion plating.

5. The method of claim 1, further comprising forming a plurality of slots in the passivation layer in the second region.

6. The method of claim 5, further comprising filling each slot of the plurality of slots with the first protective layer.

7. The method of claim 1, further comprising forming a plurality of slots in the first protective layer comprises a plurality of slots in the second region.

8. The method of claim 7, further comprising filling each slot of the plurality of slots with the interconnect layer.

9. The method of claim 1, further comprising exposing a dummy pad region through the second protection layer, the dummy pad region comprising a plurality of slots in the second protection layer.

10. The method of claim 9, wherein exposing the dummy pad regions comprises exposing the dummy pad region electrically separated from the exposed portion of the interconnect structure.

11. A method of making a packaging assembly, the method comprising:
    forming a connection structure over a first substrate, the first substrate having a first region and a second region, wherein the first region is a conductive pad and the second region is adjacent to the first region, and forming the connection structure comprises:
        forming a conductive pad on the first region;
        forming a passivation layer on the first region and the second region,
        forming a first opening the passivation layer in the first region to partially expose the conductive pad;
        forming a first polymer layer overlying the passivation layer and comprising a second opening in the first region in the first polymer layer, the second opening to exposing the conductive pad;
        forming a post-passivation interconnect (PPI) structure overlying the first polymer layer and filling the second opening of the first polymer layer, the PPI structure having a dummy pad region in the second region;
        forming a second polymer layer overlying the PPI structure and comprising a third opening exposing a landing pad region of the PPI structure, the landing pad region electrically separated from the dummy pad region, and the second polymer layer further comprising a fourth opening exposing a portion of the dummy pad region; and
        forming a barrier layer on the exposed landing pad region of the PPI structure and on the exposed portion of the dummy pad region, wherein the barrier layer comprises at least one of a nickel (Ni) layer, a palladium (Pd) layer or a gold (Au) layer; and
    joining a conductive region of a second substrate to the connection structure of the first substrate.

12. The method of claim 11, wherein joining the conductive region of the second substrate to the connection structure of the first substrate comprises:
    applying a flux material; and
    reflowing at least a portion of the connection structure of the first substrate.

13. The method of claim 11, further comprising forming a plurality of slots in the passivation layer in the second region.

14. The method of claim 13, further comprising filling each slot of the plurality of slots with the first polymer layer.

15. The method of claim 11, further comprising forming a plurality of slots in the first polymer layer comprises a plurality of slots in the second region.

16. The method of claim 15, further comprising filling each slot of the plurality of slots with the PPI structure.

17. The method of claim 11, further comprising exposing the dummy pad region through the second polymer layer, the dummy pad region comprising a plurality of slots in the second polymer layer.

18. The method of claim 17, wherein exposing the dummy pad regions comprises exposing the dummy pad region electrically separated from the exposed conductive pad.

19. A method of forming a semiconductor device, the method comprising:
    forming a passivation layer overlying a semiconductor substrate, wherein the semiconductor substrate has a first region and a second region, the first region is a conductive pad region, and the second region is adjacent to the first region;
    forming a first protective layer overlying the passivation layer;

forming an interconnect layer overlying the first protective layer, the interconnect layer having a landing pad region and a dummy pad region electrically separated from the landing pad region;

forming a second protective layer overlying the interconnect layer and comprising a first opening exposing the landing pad region and a second opening exposing a portion of the dummy pad region;

forming a barrier layer on the landing pad region and the exposed portion of the dummy pad region; and forming a solder bump on the barrier layer formed on the landing pad region.

20. The method of claim 19, further comprising:

forming a plurality of slots in the passivation layer in the second region; and filling each slot of the plurality of slots with the first protective layer.

\* \* \* \* \*